(12) United States Patent
Segawa et al.

(10) Patent No.: US 6,518,636 B2
(45) Date of Patent: Feb. 11, 2003

(54) SEMICONDUCTOR MISFET

(75) Inventors: Mizuki Segawa, Osaka (JP); Takashi Uehara, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/759,300

(22) Filed: Jan. 16, 2001

(65) Prior Publication Data

US 2001/0020707 A1 Sep. 13, 2001

(30) Foreign Application Priority Data

Jan. 20, 2000 (JP) ............................ 2000-011203

(51) Int. Cl.[7] ........................ H01L 29/786; H01L 29/94
(52) U.S. Cl. ........................ 257/411; 257/410; 257/412
(58) Field of Search ........................ 257/410, 411, 257/412

(56) References Cited

U.S. PATENT DOCUMENTS 5,811,357 A * 9/1998 Armacost et al. ............ 438/695
6,096,595 A * 8/2000 Huang ........................ 438/210
6,191,462 B1 * 2/2001 Chen-Hua .................... 257/344
6,194,294 B1 * 2/2001 Lee ............................ 438/585
6,248,633 B1 * 6/2001 Ogura et al. ................ 438/267
6,323,519 B1 * 11/2001 Gardner et al. ............. 257/336

FOREIGN PATENT DOCUMENTS

JP 08-064808 3/1996

* cited by examiner

Primary Examiner—Allan R. Wilson
(74) Attorney, Agent, or Firm—Nixon Peabody LLP; Donald R. Studebaker

(57) ABSTRACT

A conductive film for gate electrode including a polysilicon film is deposited on a semiconductor substrate, and patterned to form gate electrodes. An oxide film is formed on each side face of at least the polysilicon film, and by nitriding at least the surface portion of the oxide film, a nitride oxide film is formed on each side face of the gate electrodes. An interlayer insulating film is then deposited, and contact holes are formed through the interlayer insulating film. The existence of the nitride oxide film suppresses variation and reduction in size due to oxidation and etching of the gate side faces during resist removal and washing.

8 Claims, 5 Drawing Sheets

SEMICONDUCTOR MISFET

BACKGROUND OF THE INVENTION

The present invention relates to a MISFET-mounted semiconductor device and a method for fabricating such a semiconductor device.

With the recent advance in LSI toward higher integration, higher-speed operation, lower voltage application, and the like, reduction in sizes of gate electrodes of metal insulator semiconductor field effect transistors (MISFETs) and interconnections is under progress. Currently, in particular, MISFETs with a gate length as small as about 0.1 to 0.15 μm are just to be put into practical use.

FIGS. 4A through 4E are cross-sectional views illustrating the steps for fabrication of a conventional semiconductor device including MISFETs of a polysilicon gate structure, which is hereinafter referred to as the first prior art. The fabrication process of the semiconductor device of the first prior art will be described with reference to FIGS. 4A through 4E.

In the step shown in FIG. 4A, a silicon oxide film, which is to be gate insulating films, is formed on a silicon substrate 101 as a semiconductor substrate. A polysilicon film, which is to be gate electrodes, is formed on the silicon oxide film. On the polysilicon film, a photoresist film 104 having a desired gate electrode pattern is formed by photolithography. Using the photoresist film as a mask, the polysilicon film and the silicon oxide film are patterned by dry etching, to form gate insulating films 102 and gate electrodes 103. At this stage, the lateral size of the gate electrodes 103 (gate length) is A (for example, 0.15 μm).

In the step shown in FIG. 4B, the photoresist film 104 is removed by ashing with $O_2$ plasma. During the ashing, exposed side faces of the gate electrodes 103 made of polysilicon in n-channel MISFET formation areas are oxidized by a thickness of about 0.005 μm, for example, forming plasma oxide films 105a having a lateral thickness $x_1$ (for example, about 0.01 μm). Although omitted in FIG. 4B, a plasma oxide film is also formed on the silicon substrate 101. In addition, plasma oxide films are also formed on the side faces of gate electrodes in the other areas not shown (p-channel MISFET formation areas, and other transistor formation areas different in the thickness of the gate insulating film).

In the step shown in FIG. 4C, impurity ions are implanted in the silicon substrate 101 using the gate electrodes 103 and the plasma oxide films 105a as a mask, to form n-type LDD layers 106 for the n-channel MISFETs. This ion implantation is performed using arsenic ions under the conditions of an accelerating energy of 10 keV and a dose of $5.0 \times 10^{14}$ $cm^{-2}$, for example. During this ion implantation, the p-channel MISFET formation areas and the like are covered with a photoresist film. This photoresist film must be removed before formation of lightly-doped source/drain regions for p-channel MISFETs and the like.

FIG. 4D illustrates the state of the n-channel MISFET just after completion of ashing for removing the photoresist film covering the p-channel MISFET formation areas and the like. Due to this ashing with $O_2$ plasma, the exposed side faces and top portion of the gate electrode 103 made of polysilicon are further oxidized by a thickness of about 0.005 μm, to form plasma oxide films 105 having a lateral thickness $x_2$ (for example, about 0.02 μm). Although omitted in FIG. 4D, a plasma oxide film is also further formed on the silicon substrate 101.

FIG. 4E illustrates the state of the MISFET after washing with hydrofluoric acid for removal of particles. The plasma oxide films 105 have been removed with the washing with hydrofluoric acid. The resultant gate electrode 103 has a lateral size (gate length) of B (0.13 μm assuming that the polysilicon has been oxidized by a thickness of about 0.01 μm on each side by the twice plasma treatment as described above). That is, the lateral size of the gate electrode is gradually reduced from the original size.

FIGS. 5A through 5E are cross-sectional views illustrating the steps for fabrication of a conventional semiconductor device including MISFETs of a polymetal gate structure, which is hereinafter referred to as the second prior art. The fabrication process of the semiconductor device of the second prior art will be described with reference to FIGS. 5A through 5E.

In the step shown in FIG. 5A, a silicon oxide film, which is to be gate insulating films, is formed on a silicon substrate 101 as a semiconductor substrate. On the silicon oxide film, deposited sequentially are a polysilicon film, a tungsten nitride (WN) film or a titanium nitride (TiN) film as a barrier metal film, and a metal film made of tungsten (W), which are to be gate electrodes. A silicon nitride film is then formed on the resultant substrate by LPCVD. On the silicon nitride film, a photoresist film 107 having a desired gate electrode pattern is formed by photolithography. Using the photoresist film 107 as a mask, the silicon nitride film, the metal film, the barrier metal film, the polysilicon film, and the silicon oxide film are patterned, to form gate insulating films 102, gate electrodes 103 each composed of a bottom gate electrode 103a, a barrier metal film 103b, and a top gate electrode 103c, and gate top insulating films 108.

In the step shown in FIG. 5B, the photoresist film 107 is removed by ashing. Due to the ashing with $O_2$ plasma, exposed side faces of the gate electrodes 103 in the n-channel MISFET formation areas are oxidized, forming plasma oxide films 110. Each plasma oxide film 110 is particularly formed thick on the bottom gate electrode 103a made of polysilicon having a large oxidation rate, hardly formed on the barrier metal film 103b made of WN, and slightly formed on the top gate electrode 103c made of W. Although omitted in FIG. 5B, a plasma oxide film is also formed on the silicon substrate 101. Plasma oxide films are also formed on side faces of gate electrodes in the other areas not shown (p-channel MISFET formation areas, and other transistor formation areas different in the thickness of the gate insulating film).

In the step shown in FIG. 5C, impurity ions are implanted in the silicon substrate 101 using the gate top insulating films 108 and the gate electrodes 103 as a mask, to form n-type LDD layers 106 for the n-channel MISFETs. During this ion implantation, the p-channel MISFET formation areas and the like are covered with a photoresist film. This photoresist film must be removed before formation of p-type LDD layers for the p-channel MISFETs.

FIG. 5C illustrates the state after completion of ashing for removing the photoresist film covering the p-channel MISFET formation areas and the like and subsequent washing with hydrofluoric acid for removal of particles. Since the photoresist film covering the p-channel MISFET formation areas and the like is removed by ashing with $O_2$ plasma as in the removal of the photoresist film 107 shown in FIG. 5B, the side faces of the gate electrodes 103 are further oxidized as in the step shown in FIG. 5B, increasing the thickness of the plasma oxide films 110. That is, each plasma oxide film 110 is formed particularly thick on the bottom gate electrode 103a made of polysilicon having a large oxidation rate, hardly formed on the barrier metal film 103b made of WN, and slightly formed on the top gate electrode 103c made of W.

By the washing with hydrofluoric acid for particle removal, the plasma oxide films 110 are removed, resulting in the contour as shown in FIG. 5C. That is, the side faces of the bottom gate electrodes 103a made of polysilicon have been particularly greatly etched, the side faces of the top gate electrodes 103c made of W have been slightly etched, and the side faces of the gate top insulating films 108 made of silicon nitride have been hardly etched. As a result, the entire gate electrode has a constricted shape.

In the step shown in FIG. 5D, using the gate top insulating films 108 and the gate electrodes 103 as a mask, $BF_2$ ions are implanted in the silicon substrate 101 under the conditions of an accelerated energy of 30 keV and a dose of $5.0 \times 10^{13}$ $cm^{-2}$, for example, to form p-pocket regions 111 for the n-channel MISFETs. Thereafter, a silicon nitride film is deposited on the entire surface of the resultant substrate by LPCVD, and then etched back, to form side walls 112 on the side faces of the gate electrodes 103. The side wall 112 has a recessed contour as a whole following the unevenness of the side faces of the gate electrodes. Using the gate electrodes 103, the gate top insulating films 108, and the side walls 112 as a mask, arsenic ions are implanted in the silicon substrate 101 under the conditions of an accelerating energy of 40 keV and a dose of $4.0 \times 10^{15}$ $cm^{-2}$, for example, to form n-type heavily-doped source/drain layers 113 for the n-channel MISFETs.

In the step shown in FIG. 5E, a boron-phospho-silicate-glass (BPSG) film is deposited on the resultant substrate by atmospheric CVD, and then flattened by annealing for 30 seconds at 900° C. so that the spaces between the gate electrodes are filled with the BPSG film thereby forming an interlayer insulating film 115. During this filling, a void 116 may sometimes be generated somewhere in the interlayer insulating film 115 between the gate electrodes due to the recessed contour of the side walls 112 following the unevenness of the side faces of the gate electrodes.

Thus, the above two conventional semiconductor devices have the following problems. In the MISFET of the polysilicon gate structure as in the first prior art, the lateral size of the gate electrode becomes smaller every time the gate electrode passes through the process steps of removing a photoresist film and washing. This reduction in the lateral size of the gate electrode is not so influential as long as the gate length is sufficiently large. However, with the recent decrease in the gate length to as small as about 0.1 μm, it has turned out that the above reduction in lateral size during the fabrication process causes a problem that is not negligible. As described above, the polysilicon film of the gate electrode is oxidized on both sides by a total thickness of 0.02 μm and the oxidized portions are removed, by the twice removal of the photoresist films with $O_2$ plasma and the subsequent washing and the like. As a result, the gate length of 0.15 μm is reduced to 0.13 μm. If the gate length is 0.1 μm, it is reduced to 0.08 μm. In general, a CMOS device includes transistors of which gate insulating films have two or more different thicknesses. Such transistors different in thickness often require different ion implantation conditions. This necessitates the process step of removing a photoresist film with $O_2$ plasma several times. During the repeated process steps, the growth rate of the plasma oxide film and the rate of wet etching of the oxide film by washing vary depending on the position on the wafer. These variations are exhibited as variations in gate size, and thus the rate of errors from the design size increases. In addition, as shown in FIG. 4E, the overlap amount between the LDD layers 106 and the ends of the gate electrode 103 changes from the initial amount at the time of ion implantation. This causes a problem of increasing the parasitic resistance of the LDD layers and thus reducing the drain current. This problem will not be essentially solved by simply forming the gate electrodes with a largish gate size in expectation of reduction in the lateral size of the gate electrodes.

In the MISFET of the polymetal gate structure or a polycide gate structure as in the second prior art, in addition to the above problems described in the first prior art, the following problem arises. As shown in FIG. 5E, when the gate electrodes and interconnections are of a multilayer structure composed of materials having different etching rates, steps are formed on the exposed side faces of the multilayer structure. Due to the existence of the steps, a void may be formed when the spaces between the gate electrodes and interconnections are filled with an interlayer insulating film in a subsequent step. Such a void tends to move upward during reflowing of the interlayer insulating film to come out of the interlayer insulating film. In some cases, however, a void may fail to come outside, forming a groove on the surface of the interlayer insulating film. In a subsequent step of forming multilayer interconnections, an etching residue may be left in the groove after etching for upper interconnections, and this may possibly cause failure due to a short circuit between interconnections. short circuit between interconnections.

SUMMARY OF THE INVENTION

The object of the present invention is providing a semiconductor device with high precision and reliability that overcomes the problems related to formation of oxide films on the side faces of gate electrodes of MISFETs and interconnections and removal of the oxide films, and a method for fabricating such a semiconductor device.

The semiconductor device of the present invention includes: a semiconductor substrate; a gate electrode formed on the semiconductor substrate, at least part of the gate electrode being made of a polysilicon film; an oxide film formed on each side face of the polysilicon film; and a nitride oxide film formed by nitriding at least a surface portion of the oxide film.

The nitride oxide film having a large N content exists on the gate electrode with the oxide film therebetween. This construction is advantageous in the following points. It is possible to avoid troubles such as generation of a defect due to stress applied to a channel region that may occur if the nitride oxide film having a large N content is in direct contact with the channel region. In addition, the existence of the nitride oxide film having a large N content serves to avoid reduction in size due to repeated oxidation and etching during formation of gate electrodes. Therefore, even in the situation where design rule is further reduced for finer semiconductor devices, especially, for finer MISFETs, this construction can minimize the variation in size such as gate length and thus improve size precision.

The oxide film may be made of a plasma oxide film formed by oxygen plasma treatment. This oxidation can be done at a comparatively low temperature. Therefore, adverse influence of the oxidation on the materials constituting the gate electrode and the like is small.

The gate electrode may be composed of a single polysilicon film, and the oxide film may be formed on the entire of each side face of the gate electrode. This makes it possible to apply the present invention to a semiconductor device having the polysilicon gate structure.

The gate electrode may includes a bottom gate electrode made of a polysilicon film and a top gate electrode made of a metal silicide film formed on the bottom gate electrode, and the oxide film may be formed on each side face of the bottom gate electrode. This makes it possible to apply the present invention to a semiconductor device having the polycide gate structure. This construction is not only effective in maintaining the gate size, but also eliminates the unevenness in the contour of the side wall due to the difference in oxidation rate between the silicide film and the polysilicon film, and thus suppresses generation of a void at a position between adjacent gates in the interlayer insulating film. As a result, generation of a short circuit in upper interconnections is effectively avoided.

The gate electrode may include a bottom gate electrode made of a polysilicon film and a top gate electrode made of a metal film formed on the bottom gate electrode, and the oxide film may be formed on each side face of the bottom gate electrode. This makes it possible to apply the present invention to a semiconductor device having the polymetal gate structure. This construction is not only effective in maintaining the gate size, but also eliminates the unevenness in the contour of the side wall due to the difference in oxidation rate between the metal film and the polysilicon film, and thus suppresses generation of a void at a position between adjacent gates in the interlayer insulating film. As a result, generation of a short circuit in upper interconnections is effectively avoided.

The semiconductor device having the polycide gate structure or the polymetal gate structure may further include a metal nitride film formed on each side face of the top gate electrode. This suppresses reduction in the lateral size of the top gate electrode, deterioration of the top gate electrode due to heat treatment, and the like.

The semiconductor device having the polymetal gate structure or the polycide gate structure may further include a barrier metal film formed between the bottom gate electrode and the top gate electrode. This enhances the adhesion between the top gate electrode and the bottom gate electrode.

The device may further includes: a gate top insulating film having an etching stopper function formed on a top surface of the gate electrode; and an insulator side wall having an etching stopper function formed on each side face of the gate electrode and each side face of the gate top insulating film. The resultant semiconductor device is suitable for realizing a self-aligned contact (SAC) structure.

The method for fabricating a semiconductor device of the present invention includes the steps of: a) depositing a conductive film for gate electrode including at least a polysilicon film on a semiconductor substrate; (b) forming a gate electrode by patterning the conductive film for gate electrode; (c) forming an oxide film on each side face of at least the polysilicon film after the step (b); and (d) forming a nitride oxide film on each side face of the gate electrode by nitriding at least a surface portion of the oxide film after the step (c).

By employing the above method, the nitride oxide film is formed on each side face of the gate electrode made of a conductive film. Without the existence of the nitride oxide film, the conductive film constituting the gate electrode will be oxidized and etched every time a photoresist film for impurity implantation is removed and washing for removal of particles is performed. Due to these repeated oxidation and etching, the size of the gate electrode will be reduced and vary. Having the nitride oxide film, this problem can be suppressed. In addition, the nitride oxide film having a high nitrogen content is kept from direct contact with the gate electrode. Therefore, the trouble due to stress applied to the channel region is avoided.

In the step (c), a plasma oxide film may be formed as the oxide film by subjecting each side face of the polysilicon film to oxygen plasma treatment. This oxidation can be done at a comparatively low temperature. Therefore, adverse influence of the oxidation on the materials constituting the gate electrode and the like is suppressed.

In the step (b), the conductive film for gate electrode may be patterned by etching using as a mask a photoresist film covering gate electrode formation areas of the conductive film for gate electrode, and in the step (c), the plasma oxide film may be formed by oxidizing each side face of the polysilicon film simultaneously with removal of the photoresist film by ashing with oxygen plasma. Thus, by utilizing the process step of removing the photoresist film, the process can be simplified.

In the step (a), a single polysilicon film may be deposited as the conductive film for gate electrode. This makes it possible to apply the fabrication method of the present invention to the fabrication of a semiconductor device having the polysilicon gate structure.

In the step (a), a polysilicon film and a metal film may be deposited in this order as the conductive film for gate electrode, and in the step (b), a bottom gate electrode made of the polysilicon film and a top gate electrode made of the metal film may be formed as the gate electrode. This makes it possible to apply the fabrication method of the present invention to the fabrication of a semiconductor device having the polymetal gate structure. In particular, this method eliminates the unevenness in the contour of the side wall due to the difference in oxidation rate between the metal film and the polysilicon film, and therefore provides a semiconductor device free from generation of a void at a position between adjacent gates in the interlayer insulating film and thus generation of a short circuit in upper interconnections.

In the step (a), a polysilicon film and a silicide film may be deposited in this order as the conductive film for gate electrode, and in the step (b), a bottom gate electrode made of the polysilicon film and a top gate electrode made of the silicide film may be formed as the gate electrode. This makes it possible to apply the fabrication method of the present invention to the fabrication of a semiconductor device having the polycide gate structure. In particular, this method eliminates the unevenness in the contour of the side wall due to the difference in oxidation rate between the silicide film and the polysilicon film, and therefore provides a semiconductor device free from generation of a void at a position between adjacent gates in the interlayer insulating film and thus generation of a short circuit in upper interconnections.

In the method for fabricating a semiconductor device having the polymetal gate structure or the polycide gate structure, in the step (d), simultaneously with the formation of the nitride oxide film by nitriding at least a surface portion of the oxide film formed on each side face of the bottom gate electrode, each side face of the top gate electrode is nitrided to form a metal nitride film. This suppresses reduction in the lateral size of the top gate electrode and deterioration of the top gate electrode due to subsequent treatment.

In the step (a), a first insulating film having an etching stopper function may be deposited on the conductive film for gate electrode, in the step (b), a gate top insulating film made of the first insulating film may be formed on the gate electrode, and the method may further include, after the step (d), the step of depositing a second insulating film having an etching stopper function on the substrate and etching back the second insulating film to form a side wall made of the second insulating film on each side face of the gate electrode and each side face of the gate top insulating film. This makes it possible to provide a method for fabricating a semiconductor device suitable for the self-aligned contact structure.

DESCRIPTION OF THE PREFERRED EMBODIMENTS

Hereinafter, preferred embodiments of the present invention will be described with reference to the accompanying drawings.

Embodiment 1

FIGS. 1A through 1E are cross-sectional views illustrating the steps for fabrication of a semiconductor device including MISFETs of the polysilicon gate structure of EMBODIMENT 1 of the invention. Hereinafter, the fabrication process of the semiconductor device of this embodiment will be described with reference to FIGS. 1A through 1E.

Figure 1A:
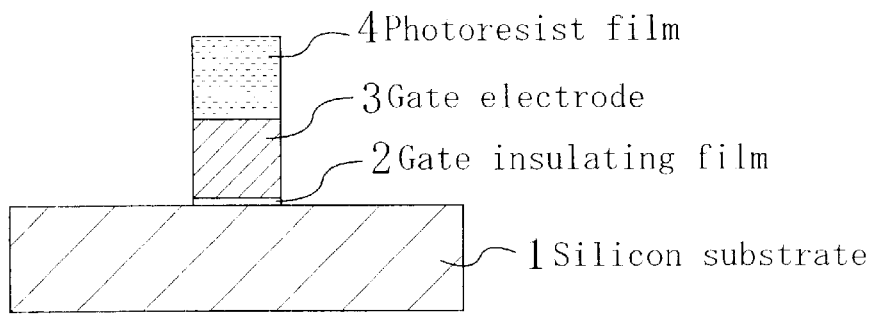
FIGS. 1A through 1E are cross-sectional views illustrating the steps for fabrication of a semiconductor device having the polysilicon gate structure as EMBODIMENT 1 of the invention.

In the step shown in FIG. 1A, a silicon oxide film, which is to be gate insulating films, is formed on a silicon substrate 1 as a semiconductor substrate. A polysilicon film, which is to be gate electrodes, is formed on the silicon oxide film. On the polysilicon film, a photoresist film 4 having a desired gate electrode pattern is formed by photolithography. Using the photoresist film 4 as a mask, the polysilicon film and the silicon oxide film are patterned by dry etching, to form gate insulating films 2 and gate electrodes 3. Note that the MISFET shown in FIGS. 1A through 1E is of an n-channel type.

Figure 1B:
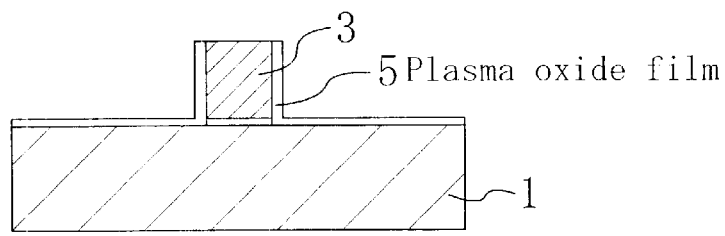

In the step shown in FIG. 1B, the photoresist film 4 is removed by ashing with $O_2$ plasma. During the $O_2$ plasma ashing (substrate temperature: 150° C. to 450° C., preferably 200° C. to 300° C.), exposed portions of the side faces of the gate electrodes 3 made of polysilicon in the n-channel MISFET formation areas are oxidized, forming plasma oxide films 5 on the side faces of the gate electrodes 3. Plasma oxide films are also formed on the side faces of gate electrodes in the other areas not shown, such as p-channel MISFET formation areas and other transistor formation areas where the gate insulating films of transistors (n-channel MISFETs and p-channel MISFETs) have a different thickness (hereinafter, these transistor formation areas are collectively called the "p-channel MISFET transistor formation areas and the like"). The plasma oxide films 5 are also formed on the exposed portions of the silicon substrate 1.

Figure 1C:
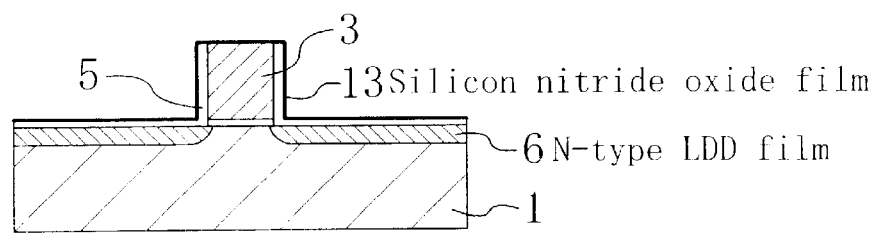

In the step shown in FIG. 1C, the resultant substrate is nitrided by rapid thermal annealing (RTA) in an ammonia atmosphere (950° C., 30 seconds), for example, for nitriding the surface portions of the plasma oxide films 5 to form silicon nitride oxide films 13. The silicon nitride oxide films 13 have a composition close to a stoichiometric composition $Si_3N_4$ at a position near the surface thereof and a composition with a smaller N fraction at a position farther from the surface. Alternatively, the nitriding may be performed for an extended period of time to change substantially the entire plasma oxide films 5 to the silicon nitride oxide films. In any case, by the nitriding, the top surfaces of the gate electrodes 3 are also nitrided into silicon nitride films.

Thereafter, using the gate electrodes 3 with the plasma oxide films 5 and the silicon nitride oxide films 13 formed on the side faces thereof as a mask, impurity ions are implanted in the silicon substrate 1, to form n-type LDD layers 6. The ion implantation is performed using arsenic ions under the conditions of an accelerating energy of about 10 keV and a dose of about $5.0 \times 10^{14}$ $cm^{-2}$, for example. During this ion implantation, the p-channel MISFET formation areas and the like not shown are covered with a photoresist film. The photoresist film covering the p-channel MISFET formation areas and the like is removed by ashing with $O_2$ plasma before lightly-doped source/drain regions for the p-channel MISFETs are formed. According to the invention, the side faces of the gate electrodes 3 made of polysilicon, which are protected with the silicon nitride oxide films 13, are prevented from being oxidized by the $O_2$ plasma treatment during the ashing (the top surfaces of the gate electrodes are also prevented from oxidation).

In the subsequent washing with hydrofluoric acid for particle removal, also, the plasma oxide films 5, which are protected with the silicon nitride oxide films 13, are prevented from being removed away.

The process steps of removal of a resist film for ion implantation, washing with hydrofluoric acid, and the like may be repeated for several times for p-channel MISFETs and MISFETs different in the thickness of the gate insulating film. During these repeated process steps, once the side faces of the gate electrodes 3 are protected with the silicon nitride oxide films 13 in the step shown in FIG. 1C, the gate electrodes 3 will not be oxidized, or the silicon nitride oxide films 13 will not be removed with hydrofluoric acid. Accordingly, the lateral size of the gate electrodes 3 will not be reduced. Thus, the LDD layers of each MISFET are kept in a self-alignment state with respect to the silicon nitride oxide films on both sides.

Figure 1D:
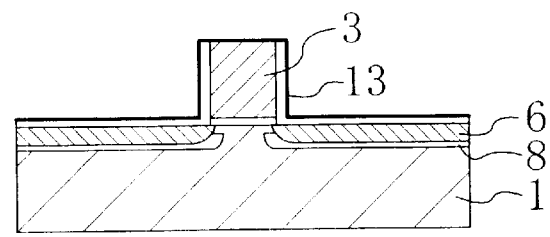

In the step shown in FIG. 1D, pocket layers for the n-channel MISFETs are formed. Specifically, after a resist film for covering the p-channel MISFET formation areas and the like is formed (not shown), $BF_2$ ions are implanted in the silicon substrate 1 under the conditions of an accelerated energy of about 30 keV and a dose of about $5.0 \times 10^{13}$ $cm^{-2}$, for example, to form p-pocket layers 8 for the n-channel MISFETs.

Figure 1E:
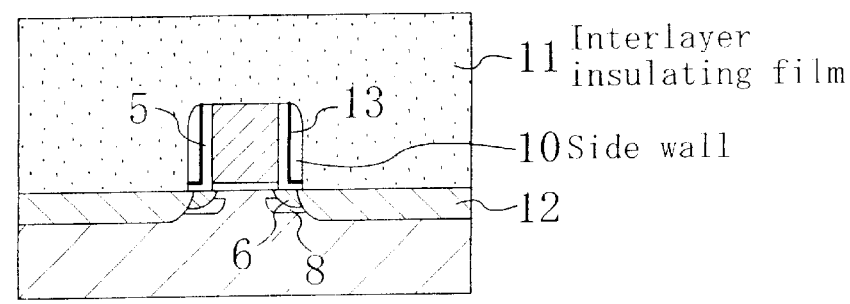

In the step shown in FIG. 1E, a silicon nitride film is deposited on the resultant substrate by LPCVD, for example, and then etched back, to form side walls 10 on the side faces of the gate electrodes 3, that is, on the silicon nitride oxide films 13. During this step, due to over-etching for the formation of the side walls, the portions of the silicon nitride oxide films 13 and plasma oxide films 5 that are not covered with the side walls 10 are normally removed. Thereafter, source/drain regions of the n-channel MISFETs are formed in the following manner. A resist film for covering the p-channel MISFET formation areas and the like is formed. Using the resist film as a mask, arsenic ions are implanted in the silicon substrate 1 under the conditions of an accelerating energy of about 40 keV and a dose of about $4.0 \times 10^{15}$ cm$^{-2}$, for example, to form n-type heavily-doped diffusion layers 12 as the source/drain regions.

A BPSG film is deposited on the resultant substrate by atmospheric CVD, and then flattened by annealing (reflowing) for 30 seconds at 900° C., for example, so that the spaces between the gate electrodes are filled with the BPSG film thereby forming an interlayer insulating film 11.

In the MISFET of the polysilicon gate structure in this embodiment, the surface portions of the plasma oxide films 5 formed during the ashing of the photoresist film with $O_2$ plasma are nitrided to form the silicon nitride oxide films 13. The existence of the silicon nitride oxide films 13 serves to block the lateral size of the gate electrode from decreasing in the subsequent repeated process steps of ashing of a photoresist film, washing with hydrofluoric acid, and the like.

In particular, the plasma oxide films 5 are not completely changed to the silicon nitride oxide films, but only the surface portions thereof are nitrided. Thus, the portions of the plasma oxide films 5 that are in contact with the silicon substrate 1 and the gate electrode 3 are left as oxide films or oxide films containing a trace amount of nitrogen (N). This advantageously blocks stress generated from the nitride oxide film having a large N content near the surface from influencing the channel region and as a result causing a trouble such as generation of a defect.

Alternatively, from the state shown in FIG. 1A, the ashing for removal of the photoresist film 4 and then the hydrofluoric acid treatment may be performed. Nitriding is then performed after the plasma oxide films are removed. In this case, although the oxide films are hardly left as the underlying layers of the silicon nitride oxide films, it is possible to suppress reduction in the lateral size of the gate electrodes due to the existence of the silicon nitride oxide films.

Otherwise, after the step shown in FIG. 1A, plasma oxide films may be once formed by ashing and then removed by washing with hydrofluoric acid. Thereafter, oxide films may be formed on the top surfaces and side faces of the gate electrodes and on the silicon substrate by thermal oxidation or plasma oxidation, and then nitrided. This process is advantageous in that washing of the substrate surface, including removal of particles on the substrate, is ensured in a more reliable manner.

Embodiment 2

FIGS. 2A through 2E are cross-sectional views illustrating the steps for fabrication of a semiconductor device including MISFETs of the polymetal gate structure of EMBODIMENT 2 of the invention. Hereinafter, the fabrication process of the semiconductor device of this embodiment will be described with reference to FIGS. 2A through 2E. Note that the MISFET shown in FIGS. 2A through 2E is of an n-channel type.

Figure 2A:
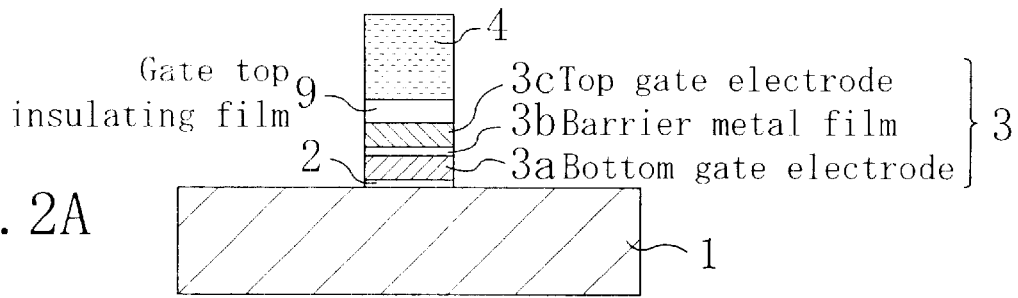
FIGS. 2A through 2E are cross-sectional views illustrating the steps for fabrication of a semiconductor device having the polymetal gate structure as EMBODIMENT 2 of the invention.

In the step shown in FIG. 2A, a silicon oxide film, which is to be gate insulating films, is formed on a silicon substrate 1 as a semiconductor substrate. On the silicon oxide film, sequentially deposited are: a polysilicon film, which is to be bottom gate electrodes; a tungsten nitride (WN) film or a titanium nitride (TiN) film as a barrier metal film; a tungsten (W) film (or a film of another metal), which is to be top gate electrodes; and a silicon nitride film, which is to be gate top insulating films. On the silicon nitride film, a photoresist film 4 having a desired gate electrode pattern is formed by photolithography. Using the photoresist film 4 as a mask, the silicon nitride film, the W film, the WN film, the polysilicon film, and the silicon oxide film are patterned by dry etching, to form gate insulating films 2, bottom gate electrodes 3a, barrier metal films 3b, and top gate electrodes 3c, and gate top insulating films 9. Thus, the gate electrodes 3 of the polymetal structure each composed of the bottom gate electrode 3a, the barrier metal film 3b, and the top gate electrode 3c are provided. The barrier metal film 3b is not necessarily required.

Figure 2B:
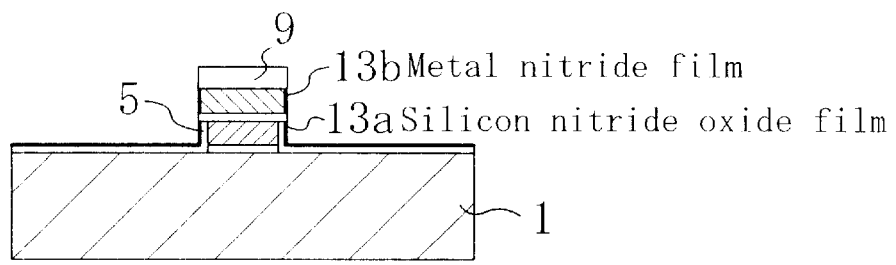
Figure 5A:
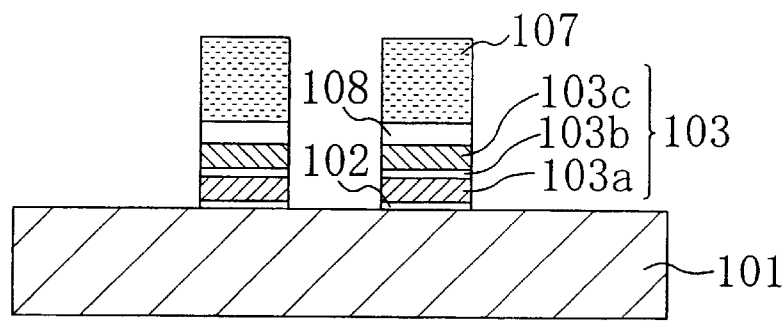
FIGS. 5A through 5E are cross-sectional views illustrating the steps for fabrication of the conventional semiconductor device having the polymetal gate structure as the second prior art.
Figure 5B:
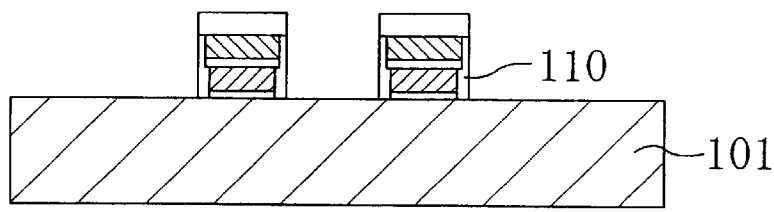
Figure 5C:
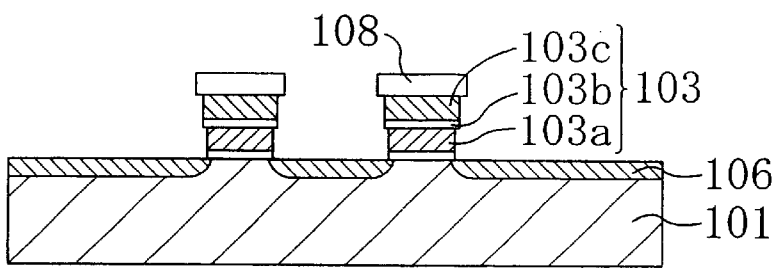
Figure 5D:
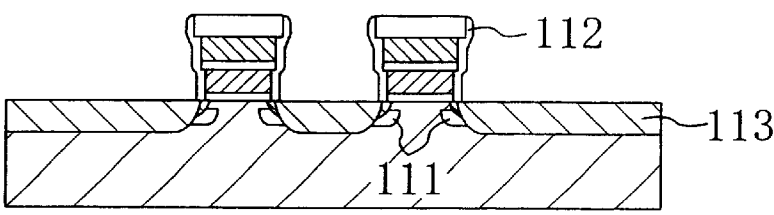
Figure 5E:
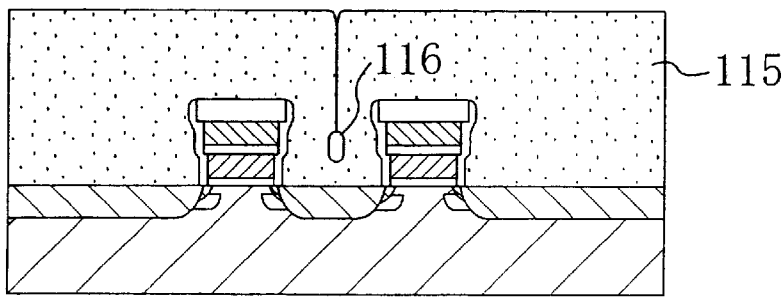

In the step shown in FIG. 2B, the photoresist film 4 is removed by ashing. Due to $O_2$ plasma used during the ashing, exposed side faces of the gate electrodes 3 are oxidized, forming plasma oxide films 5. In this oxidation, thick oxide films are formed on the side faces of the bottom gate electrodes 3a made of polysilicon having a large oxidation rate. The side faces of the top gate electrodes 3c made of W are slightly oxidized, but the side faces of the barrier metal films 3b made of WN are hardly oxidized. The plasma oxide films 5 are also formed on the exposed portions of the silicon substrate 1. Although not shown in FIG. 5B, plasma oxide films are also formed in the p-channel MISFET formation areas and the like.

Thereafter, the resultant substrate is nitrided by rapid thermal annealing (RTA) in an ammonia atmosphere (950° C., 30 seconds), for example. This nitrides the surface portions of the plasma oxide films 5 on the bottom gate electrodes 3a and the silicon substrate 1, and the side faces of the top gate electrodes 3c, thereby forming silicon nitride oxide films 13a on the plasma oxide films 5 located on the bottom gate electrodes 3a and the silicon substrate 1, while forming metal nitride films (WN films) 13b on the side faces of the top gate electrodes 3c. No additional nitride films are formed on the barrier metal films 3b that are originally nitride films. However, the N concentration in the barrier metal films 3b may possibly be increased by this nitriding. Plasma oxide films are slightly formed on the side faces of the top gate electrodes 3c before the nitriding as described above. Such plasma oxide films on the side faces of the top gate electrodes 3c are substantially completely nitrided during this nitriding process under general process conditions, and change to the metal nitride films 13b. The silicon nitride oxide films 13a on the plasma oxide films 5 have a composition close to a stoichiometric composition $Si_3N_4$ at a position near the surface thereof and a composition with a smaller N fraction at a position farther from the surface. Such silicon nitride oxide films 13a and metal nitride films 13b are also formed in the p-channel MISFET formation areas and the like although not shown. Alternatively, the nitriding may be performed for an extended period of time to change substantially the entire plasma oxide films 5 to the silicon nitride oxide films.

Figure 2C:
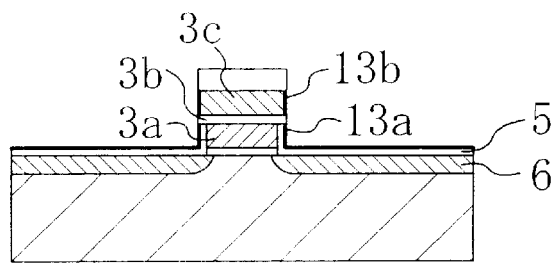

In the step shown in FIG. 2C, using the gate top insulating films 9 and the gate electrodes 3 as a mask, impurity ions are implanted in the silicon substrate 1, to form n-type LDD layers 6. The ion implantation is performed using arsenic ions under the conditions of an accelerating energy of about 10 keV and a dose of about $5.0 \times 10^{14}$ cm$^{-2}$ for the formation of n-channel MISFETs, for example. During this ion implantation, the p-channel MISFET formation areas and the like are covered with a photoresist film. The photoresist film for covering the p-channel MISFET formation areas and the like is removed by ashing with $O_2$ plasma before lightly-doped source/drain regions for the p-channel MISFETs are formed. According to the invention, the side faces of the gate electrodes 3 of the n-channel MISFETs, which are protected with the silicon nitride oxide films 13a and the metal nitride films 13b, are prevented from being oxidized by the $O_2$ plasma treatment. Moreover, the silicon nitride oxide films 13a and the metal nitride films 13b are not removed during the subsequent washing with hydrofluoric acid for particle removal. This prevents reduction in the lateral size of the gate electrodes 3.

Thereafter, the process steps of removal of a resist film for ion implantation, washing with hydrofluoric acid, and the like may be repeated for several times for ion implantation for p-channel MISFETs and MISFETs different in the thickness of the gate insulating film. In these process steps, also, once the side faces of the gate electrodes 3, especially, the bottom gate electrodes 3a are protected with the silicon nitride oxide films 13a in the step shown in FIG. 2B, the bottom gate electrodes 3a will not be oxidized, and thus the lateral size of the bottom gate electrodes 3a will not be reduced. Thus, the LDD layers of each MISFET are kept in a self-alignment state with respect to the silicon nitride oxide films on both sides.

Figure 2D:
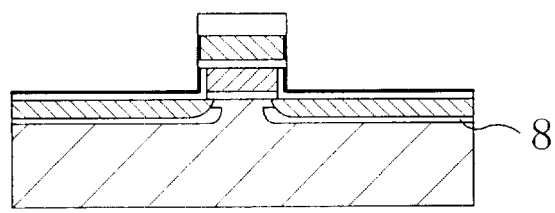

In the step shown in FIG. 2D, pocket layers for the n-channel MISFETs are formed. Specifically, after a resist film for covering the p-channel MISFET formation areas and the like is formed (not shown), $BF_2$ ions are implanted in the silicon substrate 1 under the conditions of an accelerated energy of about 30 keV and a dose of about $5.0 \times 10^{13}$ $cm^{-2}$, for example, to form p-pocket layers 8.

Figure 2E:
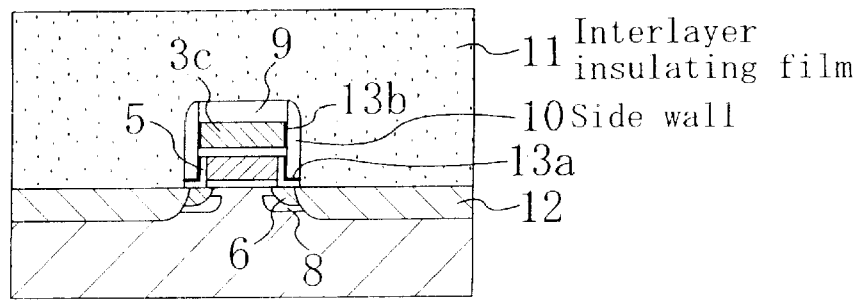

In the step shown in FIG. 2E, a silicon nitride film is deposited on the resultant substrate by LPCVD, for example, and then etched back, to form side walls 10 on the side faces of the gate electrodes 3, that is, on the silicon nitride oxide films 13a, the metal nitride films 13b, and the like, and on the side faces of the gate top insulating films 9. Thereafter, source/drain regions of the n-channel MISFETs are formed in the following manner. A resist film for covering the p-channel MISFET formation areas and the like is formed. Using the resist film as a mask, arsenic ions are implanted in the silicon substrate 1 under the conditions of an accelerating energy of about 40 keV and a dose of about $4.0 \times 10^{15}$ $cm^{-2}$, for example, to form n-type heavily-doped diffusion layers 12 as the source/drain regions.

A BPSG film is deposited on the resultant substrate by atmospheric CVD, and then flattened by annealing (reflowing) for 30 seconds at 900° C., for example, so that the spaces between the gate electrodes are filled with the BPSG film thereby forming an interlayer insulating film 11.

In the MISFET of the polymetal gate structure in this embodiment, the surface portions of the plasma oxide films 5 formed during the ashing of the photoresist film with $O_2$ plasma are nitrided to form the silicon nitride oxide films 13a. Simultaneously, the side faces of the top gate electrode 3c are nitrided to form the metal nitride films 13b. The existence of the silicon nitride oxide films 13a and the metal nitride films 13b serves to block reduction in the lateral sizes of the bottom gate electrode 3a and the top gate electrode 3c and deterioration of the metal film constituting the top gate electrode 3a in the subsequent repeated process steps of ashing of a photoresist film, washing with hydrofluoric acid, and the like.

In particular, the entire plasma oxide films 5 are not changed to the silicon nitride oxide films, but only the surface portions thereof are nitrided. Thus, the portions of the plasma oxide films 5 that are in contact with the silicon substrate 1 and the bottom gate electrode 3a are left as oxide films or oxide films containing a trace amount of nitrogen (N). If the nitride oxide film with a large N content having a composition close to a stoichiometric composition of a nitride film is in direct contact with the bottom end of the bottom gate electrode 3a, stress may be generated in the channel region and the like of the silicon substrate 1. In this embodiment with the above construction, this trouble can be advantageously avoided.

As an alternative method, from the state shown in FIG. 2A where the gate electrodes and the like are formed by patterning, the exposed side faces of the bottom gate electrodes 3a, the top gate electrodes 3c, and the like may be nitrided, and then the formation of LDD layers and the subsequent steps may be performed. In this case, although oxide films hardly exist as the underlying layers of the silicon nitride oxide films, it is possible to suppress reduction in the lateral size of the gate electrodes due to the existence of the silicon nitride oxide film.

Embodiment 3

FIGS. 3A through 3E are cross-sectional views illustrating the steps for fabrication of a semiconductor device including MISFETs of the self-aligned contact structure and the polymetal gate structure of EMBODIMENT 3 of the invention. Hereinafter, the fabrication process of the semiconductor device of this embodiment will be described with reference to FIGS. 3A through 3E. Note that the MISFETs shown in FIGS. 3A through 3E are of an n-channel type. In this embodiment, the present invention is applied to a semiconductor device that includes MISFETs of the polymetal structure as in EMBODIMENT 2, has a short intergate distance, and realizes self-aligned contact (SAC).

The steps shown in FIGS. 3A through 3D are the same as the steps shown in FIGS. 2A through 2D in EMBODIMENT 2. Specifically, formed are the gate insulating films 2 made of a silicon oxide film, the bottom gate electrodes 3a made of a polysilicon film, the barrier metal films 3b made of a tungsten nitride (WN) film, the top gate electrodes 3c made of a tungsten (W) film, and the gate top insulating films 9 made of a silicon nitride film. That is, the gate electrodes 13 of the polymetal structure each composed of the bottom gate electrode 3a, the barrier metal film 3b, and the top gate electrode 3a are formed. The barrier metal film 3b is not necessarily required.

Figure 3A:
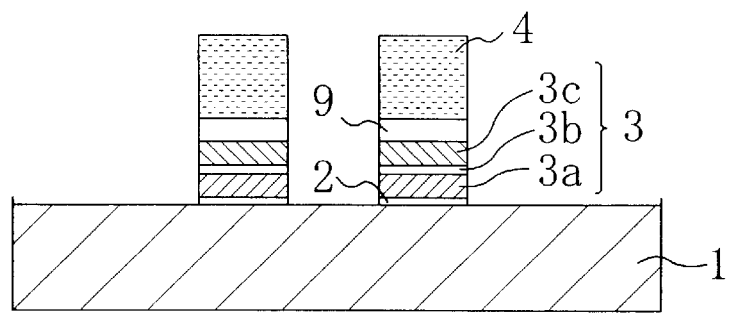
FIGS. 3A through 3E are cross-sectional views illustrating the steps for fabrication of a semiconductor device having the self-aligned contact structure and the polymetal gate structure as EMBODIMENT 3 of the invention.
Figure 3B:
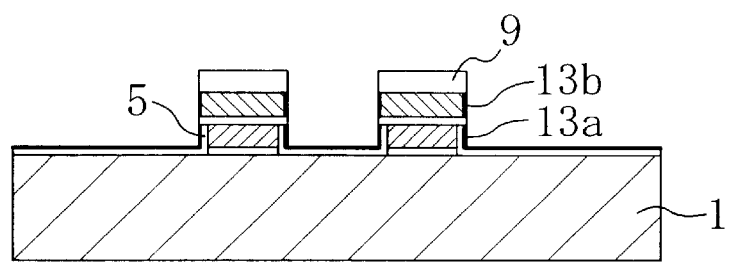
Figure 3C:
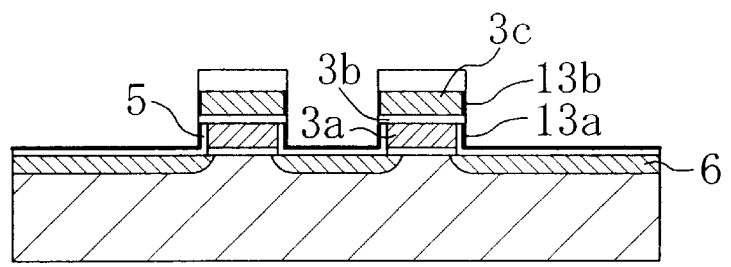
Figure 3D:
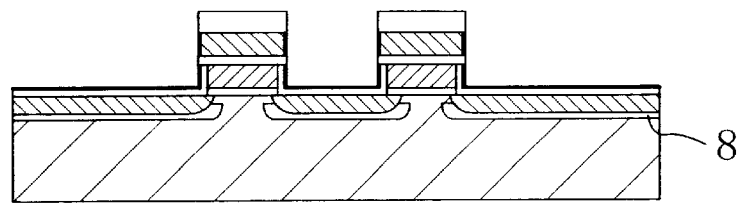
Figure 3E:
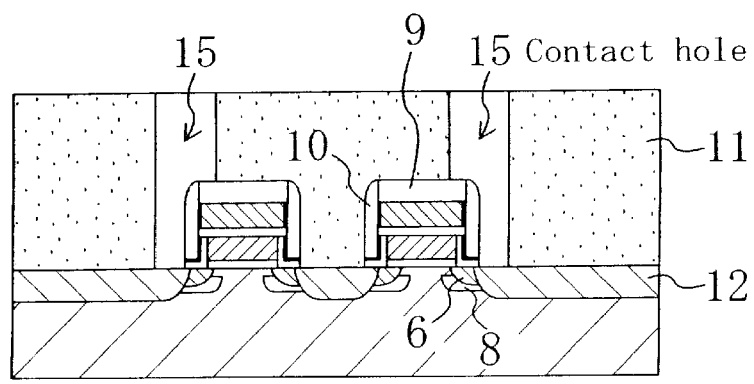
Figure 4A:
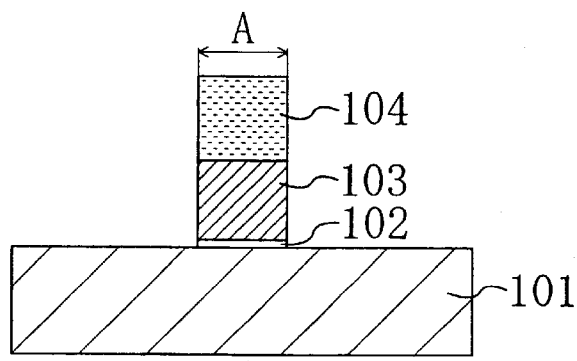
FIGS. 4A through 4E are cross-sectional views illustrating the steps for fabrication of the conventional semiconductor device having the polysilicon gate structure as the first prior art.
Figure 4B:
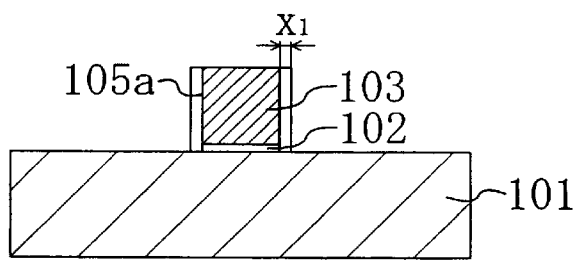
Figure 4C:
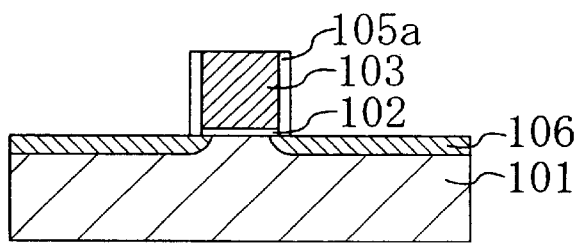
Figure 4D:
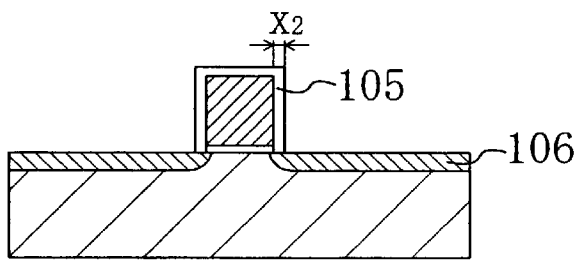
Figure 4E:
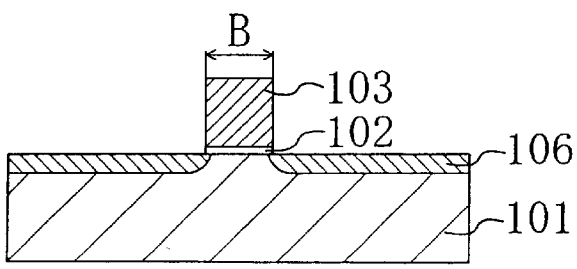

In the step shown in FIG. 3E, a silicon nitride film is deposited on the resultant substrate by LPCVD, for example, and then etched back, to form side walls 10 on the side faces of the gate electrodes 3, that is, on the silicon nitride oxide films 13a, the metal nitride films 13b, and the like, and on the side faces of the gate top insulating films 9. Thereafter, source/drain regions of the n-channel MISFETs are formed in the following manner. A resist film is formed to cover the p-channel MISFET formation areas and the like. Using the resist film as a mask, arsenic ions are implanted in the silicon substrate 1 under the conditions of an accelerating energy of about 40 keV and a dose of about $4.0 \times 10^{15}$ $cm^{-2}$, for example, to form n-type heavily-doped diffusion layers 12 as the source/drain regions.

A BPSG film, for example, is deposited on the resultant substrate by atmospheric CVD, and then flattened by annealing (reflowing) for 30 seconds at 900° C., for example, so that the spaces between the gate electrodes are filled with the BPSG film thereby forming an interlayer insulating film 11. According to the invention, by the existence of the silicon nitride oxide films 13a and the metal nitride films 13b formed in the step shown in FIG. 3B, the bottom gate electrodes 3a and the top gate electrodes 3c are not oxidized in the subsequent steps. This prevents reduction in the lateral sizes of the bottom gate electrodes 3a and the top gate electrodes 3c, and thus prevents the side walls 10 from having an uneven contour. As a result, generation of a void at a position between the gate electrodes in the interlayer insulating film 11 is suppressed.

Contact holes 15 are formed to extend through the interlayer insulating film 11 to the n-type heavily-doped diffusion layers 12. Since each gate electrode 3 is protected with the gate top insulating film 9 made of a silicon nitride film on the top and the side walls 10 made of a silicon nitride film on the sides, self-aligned contact (SAC) can be realized.

In this embodiment, in addition to the effects described in EMBODIMENT 2, the following effects are obtained. The contour of the side walls 10 is not uneven due to the existence of the silicon nitride oxide films 13a. This suppresses generation of a void at a position between the gate electrodes in the interlayer insulating film 11. The resultant semiconductor device is highly reliable without causing a short circuit between interconnections during formation of upper interconnections and the like.

The other effect is provided during the formation of the self-aligned contact holes shown in FIG. 3E. In general, when a self-aligned contact hole is formed through the interlayer insulating film with respect to the gate electrode, an oxide film existing between the side wall and the gate top insulating film may be etched resulting in removal of the top portion of the side wall. This may generate a short circuit between the gate electrode 3 and a contact material (plug, for example). Such an oxide film is required for blocking direct contact of a nitride film, which is to be the side wall, with the bottom portion of the gate electrode so that stress will not be applied to the channel region due to this direct contact. In the conventional semiconductor device, therefore, it is difficult to realize self-aligned contact without loss of reliability.

In this embodiment, however, no oxide film is formed between the gate top insulating film 9 or the top gate electrode 3c and the side wall 10 made of a nitride film. Therefore, the top portion of the side wall is not removed during the formation of a self-aligned contact hole, and thus, generation of a short circuit between the self-aligned contact hole and the gate electrode 3 is effectively prevented. Moreover, due to the existence of the plasma oxide films 5 on the side faces of the bottom gate electrode 3a, the silicon nitride oxide films 13a having a large N content are blocked from direct contact with the gate electrode 3a. Therefore, the trouble of generating stress in the channel region of the silicon substrate 1 and the like are avoided, which will be generated when the nitride oxide film with a large N content having a composition close to a stoichiometric composition of a nitride film comes into direct contact with the bottom end of the bottom gate electrode 3a. Thus, this embodiment provides a great effect of avoiding the trouble of generating a defect due to stress applied to the silicon substrate 1 while adopting the self-aligned contact structure.

In EMBODIMENT 3, the nitride film for the side walls 10 may be deposited after the silicon nitride oxide films 13a and the metal nitride films 13b are removed. In this case, also, as far as the plasma oxide films 5 remain on the side faces of the bottom gate electrode 3a, the above effect is obtained. That is, self-aligned contact can be realized while avoiding the trouble due to stress applied to the silicon substrate 1.

In the above embodiments, described was nitriding of plasma oxide films formed on the side faces of the gate electrodes of MISFETs. Gate lines extending over device isolation insulating films and the like are generally continuous with the gate electrodes. Therefore, generally, gate lines have the same structure as the gate electrodes described above.

In the above embodiments, the nitriding is performed immediately after the ashing for removal of a photoresist film for gate electrode formation. Alternatively, the nitriding may not be performed at this occasion, but washing with hydrofluoric acid and the like may follow the ashing. The nitriding may be performed immediately after the ashing for removal of a photoresist film for ion implantation for formation of LDD layers and the like in any of the MISFET formation areas. The ashing in this case is repeated a plurality of times together with the subsequent washing with hydrofluoric acid. Therefore, the lateral size of the gate electrodes in any of the MISFET formation areas may be reduced to some extent. It is however possible to prevent reduction in the lateral size of the gate electrodes in the subsequent repeated process steps of ashing and washing with hydrofluoric acid.

In EMBODIMENTS 1 and 2, the side walls 10 may be formed of an oxide film, not a nitride film. The present invention is also applicable to structures having no side walls.

In EMBODIMENTS 2 and 3, the present invention is also applicable to a semiconductor device including MISFETS of the polycide gate structure, not the polymetal gate structure.

In EMBODIMENT 3, the gate top insulating films may not be made of a nitride film, but may be made of an insulating film having a high etching selection ratio with respect to the interlayer insulating film. In EMBODIMENT 1, a gate top insulating film made of an insulating film having a high etching selection ratio with respect to the interlayer insulating film (for example, a silicon nitride film) may be formed, to realize self-aligned contact.

The side faces of the gate electrodes may be oxidized by RTA. The nitriding according to the invention is also applicable to this case. The plasma oxide films 5 may be further thickened by additionally forming an oxide film by plasma oxidation, thermal oxidation, and the like after the formation of the oxide film by the ashing with oxygen plasma for removal of the photoresist film.

In EMBODIMENTS 2 and 3, after the removal of the photoresist film for gate patterning by ashing (formation of the plasma oxide films), the plasma oxide films may be removed by washing with hydrofluoric acid and the like. Thereafter, the resultant substrate may be subjected to oxygen plasma treatment to form plasma oxide films on the side faces of the gate electrodes and on the silicon substrate. The plasma oxide films are then nitrided. This process is advantageous in that cleaning of the substrate surface including removal of particles on the substrate is ensured in a more reliable manner.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. A semiconductor device comprising:
   a semiconductor substrate;
   a gate electrode formed on the semiconductor substrate, the gate electrode being made of a polysilicon film;
   an oxide film formed on each side face of the polysilicon film;

a nitride oxide film formed by nitriding only a surface portion of the oxide film; and an insulator side wall formed on the nitride oxide film on each side face of the gate electrode.

2. A semiconductor device comprising:

a semiconductor substrate;

a gate electrode having a bottom gate electrode made of a polysilicon film and a top gate electrode made of a metal film formed on the bottom gate electrode on the semiconductor substrate;

an oxide film formed on each side face of the bottom gate electrode;

a nitride oxide film formed by nitriding at least a surface portion of the oxide film; and a metal nitride film formed on each side face of the top gate electrode.

3. The device of claim 2, further comprising a barrier metal film formed between the bottom gate electrode and the top gate electrode.

4. The device of claim 2, further comprising:

a gate top insulting film having an etching stopper function formed on a top surface of the gate electrode; and an insulator side wall having an etching stopper function formed on each side face of the gate electrode and each side face of the gate top insulating film.

5. A semiconductor device comprising:

a semiconductor substrate;

a gate electrode having a bottom gate electrode made of a polysilicon film and a top gate electrode made of a metal film formed on the bottom gate electrode on the semiconductor substrate;

an oxide film formed on each side face of the bottom gate electrode;

a nitride oxide film formed by nitriding at least a surface portion of the oxide film; and a metal nitride film formed on each side face of the top gate electrode.

6. The device of claim 5, further comprising a barrier metal film formed between the bottom gate electrode and the top gate electrode.

7. The device of claim 5, further comprising:

a gate top insulating film having an etching stopper function formed on a top surface of the gate electrode; and an insulator side wall having an etching stopper function formed on each side face of the gate electrode and each side face of the gate top insulating film.

8. The device of claim 1, wherein the insulator side wall is made of a silicon nitride film.

* * * * *

UNITED STATES PATENT AND TRADEMARK OFFICE
CERTIFICATE OF CORRECTION

PATENT NO. : 6,518,636 B2 Page 1 of 1
DATED : February 11, 2003
INVENTOR(S) : Mizuki Segawa et al.

It is certified that error appears in the above-identified patent and that said Letters Patent is hereby corrected as shown below:

Column 15,
Line 10, please insert -- silicide -- before "film".

Signed and Sealed this

Twelfth Day of August, 2003

JAMES E. ROGAN
*Director of the United States Patent and Trademark Office*